United States Patent
Kinoshita et al.

(10) Patent No.: US 7,442,052 B2
(45) Date of Patent: Oct. 28, 2008

(54) JUNCTION BLOCK HAVING IMPROVED SUPPORT FOR ITS PRINTED CIRCUIT BOARD

(75) Inventors: Kousuke Kinoshita, Kosai (JP); Koki Sato, Kosai (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/740,385

(22) Filed: Apr. 26, 2007

(65) Prior Publication Data

US 2007/0254533 A1 Nov. 1, 2007

(30) Foreign Application Priority Data

Apr. 26, 2006 (JP) ............................ P2006-122357

(51) Int. Cl.
*H01R 12/00* (2006.01)
(52) U.S. Cl. .................................................. 439/76.2
(58) Field of Classification Search ................ 439/76.1, 439/76.2

See application file for complete search history.

(56) References Cited

U.S. PATENT DOCUMENTS

| 6,597,578 | B2 * | 7/2003 | Shiina et al. ................. 361/728 |
| 6,677,521 | B2 * | 1/2004 | Sumida et al. ................. 174/50 |
| 6,971,888 | B2 * | 12/2005 | Takeuchi et al. ........... 439/76.2 |
| 2004/0043647 | A1 * | 3/2004 | Takeuchi .................... 439/76.2 |
| 2006/0141824 | A1 * | 6/2006 | Kubota et al. .............. 439/76.2 |

FOREIGN PATENT DOCUMENTS

JP 11-27829 A 1/1999

* cited by examiner

*Primary Examiner*—Tho D Ta
(74) *Attorney, Agent, or Firm*—Sughrue Mion, PLLC

(57) ABSTRACT

A junction block includes: a printed circuit board; a fuse block; connector blocks; and an inner cover for providing a stiffness to an assembly integrating the printed circuit board, the fuse block and the connector block; and fixing parts for fixing the fuse block and the connector blocks to the inner cover together. The fuse block and the connector blocks are fixed to the inner cover through the fixing parts.

4 Claims, 8 Drawing Sheets

JUNCTION BLOCK HAVING IMPROVED SUPPORT FOR ITS PRINTED CIRCUIT BOARD

BACKGROUND OF THE INVENTION

1. Field of the Invention

This invention relates to a junction block which integrally connects and distributes a supply circuit to load circuits such as a controller.

2. Related Art

As an example of the conventional junction block, there is known the one in which electric components are accommodated among an upper cover, an intermediate cover and a lower cover (See JP-A-11-027829, for example).

As shown in FIG. 8, JP-A-11-027829 shows that a junction block 100 accommodates a wiring board 104, a bus bar circuit boar 105 and a printed circuit board 106, connectors 107,108, a fuse mounting portion 109 and a relay mounting portion 110 in a junction box body having a box-like shape configured by an upper cover 101, an intermediate cover 102 and a lower cover 103 that are made of synthetic resin.

The wiring board 104 is connected with crimping parts at one ends of L-shaped terminals 112 while wiring a plurality of wires 111 on an insulating board. Tab-like contact parts at the other ends of the L-shaped terminals 112 project into a connector housing to form the connector 107.

The bus bar circuit 105 wires a plurality of bus bars 113 on the insulating board, so that terminal parts of the bus bars 113 are located within the fuse mounting portion 109. The printed circuit board 106 is provided with a printed circuit with a predetermined pattern on the insulating board, so that the printed circuit board 106 and the wiring board 104 are connected with each other through an elongated terminal 114. Terminals 115 shaped into L-shape connected with the printed circuit board 106 project into the connector 108. The connectors 107,108 and the fuse mounting portion 109 are projected to outside through the intermediate cover 102. The printed circuit board 106 is fixed to the intermediate cover 102 and the lower cover 103 by an attachment plate 116 and screws 117.

However, while the above-described JP-A-11-027829 has a structure in which the bus bars 113 are wired on the insulating board, in case that the bus bars 113 that are rigid members are omitted and replaced with other component with required functions, the stiffness of the printed circuit board 106 is lowered. Accordingly, there is a fear that the printed circuit would be broken or the printed circuit board 106 would be damaged, when stress such as bending stress is applied to the printed circuit board 106.

SUMMARY OF THE INVENTION

The present invention has been made in view of the above circumstances, and an object of the invention is to provide a junction block which is capable of providing stable quality by avoiding stress to the printed circuit board.

1) A junction block according to the invention includes:

a printed circuit board on which a distribution wiring circuit is formed;

a fuse block on which a plurality of fuse electrically connected with the distribution wiring circuit of the printed circuit board are mounted and which is fixed on the printed circuit board;

a connector block which supports connector terminals electrically connected with the distribution wiring circuit of the printed circuit board and which is fixed on the printed circuit board;

an inner cover for providing a stiffness to an assembly integrating the printed circuit board, the fuse block and the connector block; and fixing parts for fixing the fuse block and the connector block to the inner cover;

wherein the fuse block and the connector block are fixed to the inner cover through the fixing parts.

According to the invention described in the above 1), the assembly of the fuse block and the connector block is provided with high stiffness in the printed circuit board, by fixing the fuse block and the connector block to the inner cover through the fixing parts. Accordingly, even though rigid member such as bus bar is not mounted, the junction block still has stable quality since stress such as bending stress is not directly applied to the printed circuit board. 2) Further, according to the invention, in the junction block as described in the above 1), it is characterized in that the fixing parts includes a slide engaging portion having a projection having T-shape or L-shape, a hole having a shape corresponding to the projection.

According to the invention described in the above 2), as the fixing parts, by using the slide engaging portion having the projection having T-shape or L-shape, and the hole having a shape corresponding to the projection, the mating operation can be performed by a simple way as compared with screw fixture, so that the fuse block and the connector block can be fixed to the inner cover without positional error.

3) Furthermore, according to the invention, in the junction block as described in the above 1) or 2), the inner cover includes a plate portion disposed in parallel with the printed circuit board, and the fixing parts are disposed in outer edge portion of the plate portion.

According to the invention described in the above 3), the assembly integrating the printed circuit board, the fuse block and the connector block is fixed to the inner cover through the fixing parts disposed on the outer edge portion of the plate portion of the inner cover, so that the assembly can be fixed at a position apart from the printed circuit board that is disposed in parallel with the plate portion of the inner cover. Accordingly, even if the stress such as the bending stress is applied to the inner cover, the stress is not directly applied to the printed circuit board.

According to the junction block of the present invention, it is possible to prevent the problem that the printed circuit board is damaged due to the stress applied to the printed circuit board. Accordingly, the advantage can be obtained that the stable quality of the junction block cab be provided by avoiding the stress applied to the printed circuit board.

DETAILED DESCRIPTION OF THE PREFERRED EMBODIMENTS

A preferred embodiment of the present invention will now be described in detail with reference to the drawings.

Figure 1:
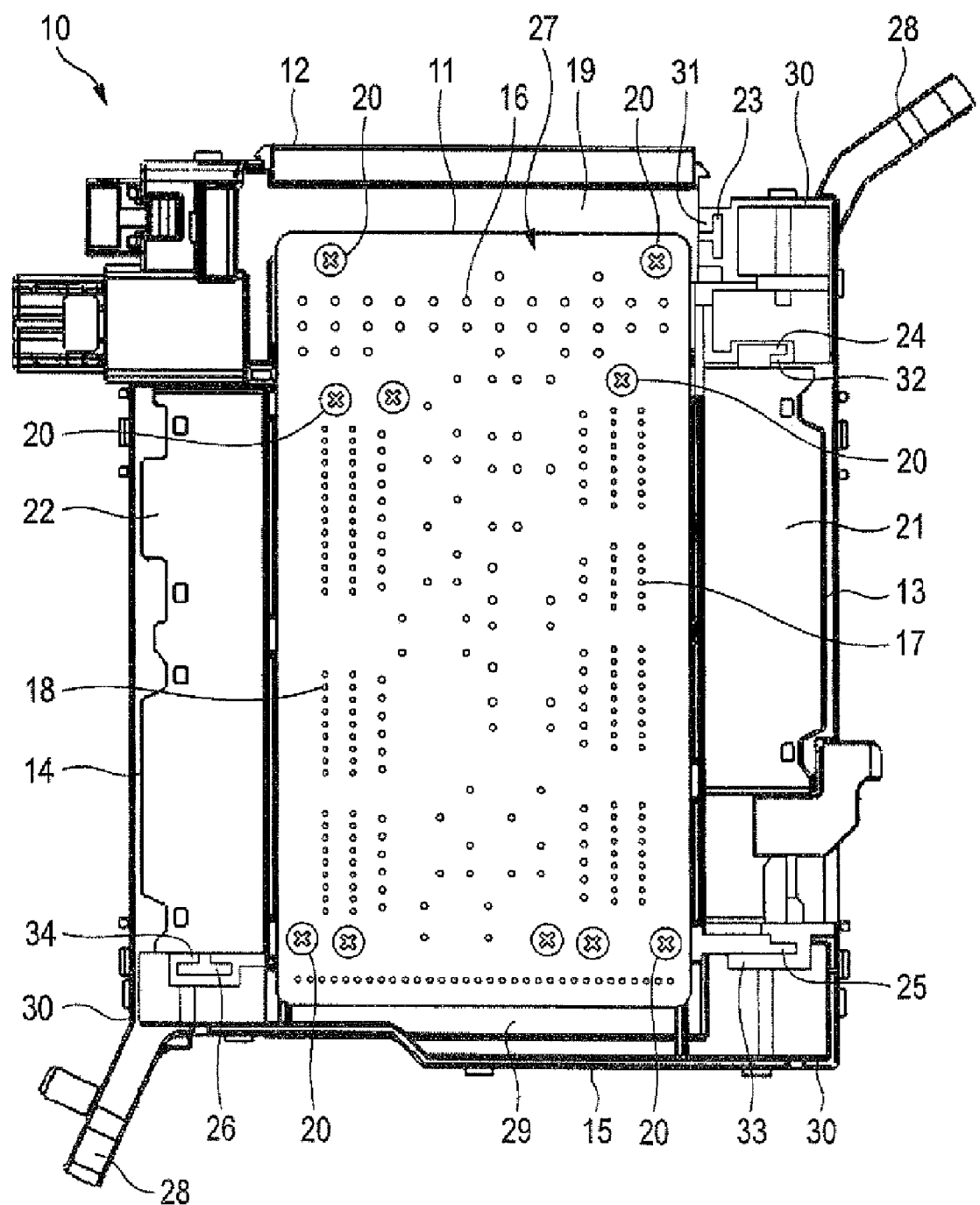
FIG. 1 is a plan view of the junction block according to one embodiment of the invention.
Figure 2:
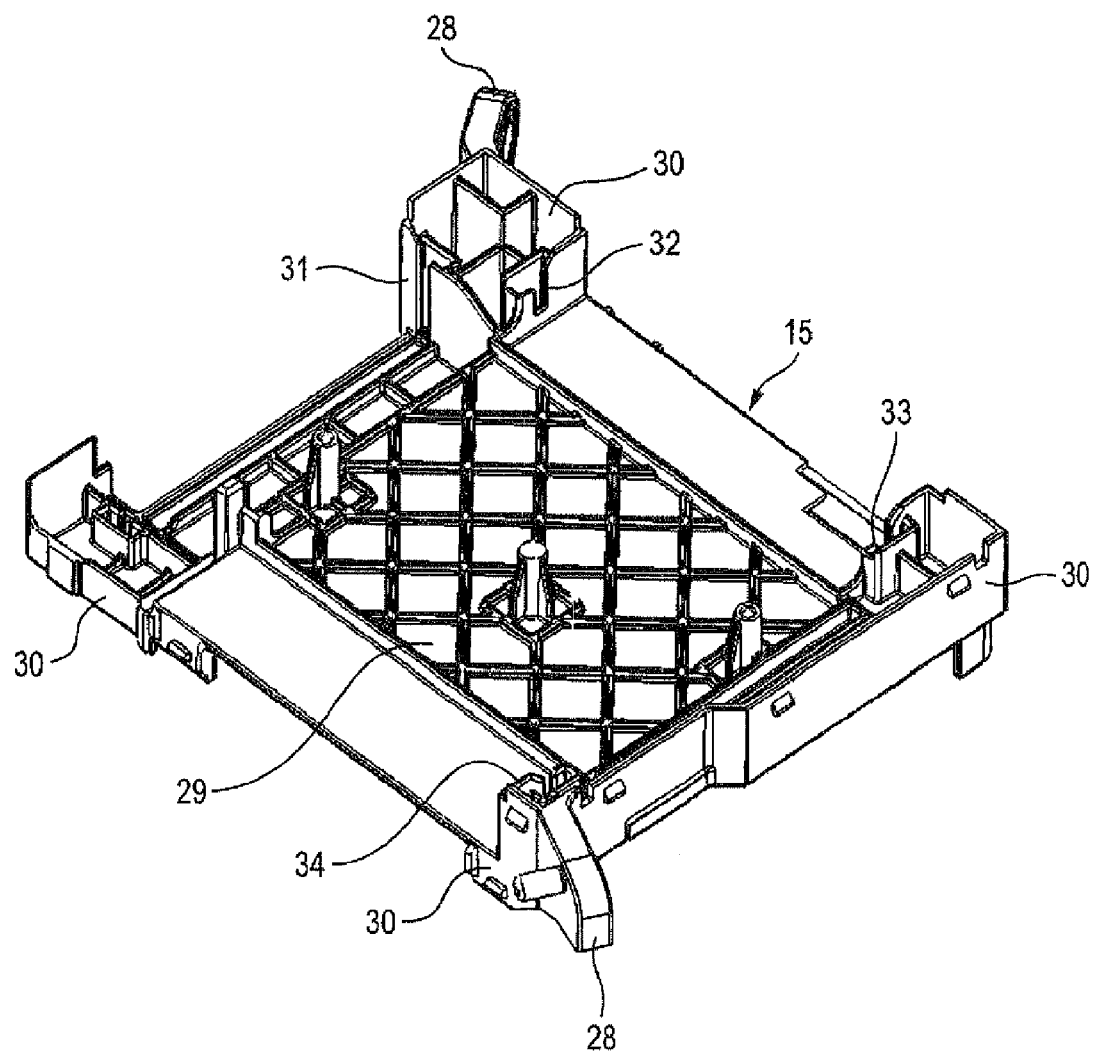
FIG. 2 is an external perspective view of the inner cover used in the junction block shown in FIG. 1.
Figure 3:
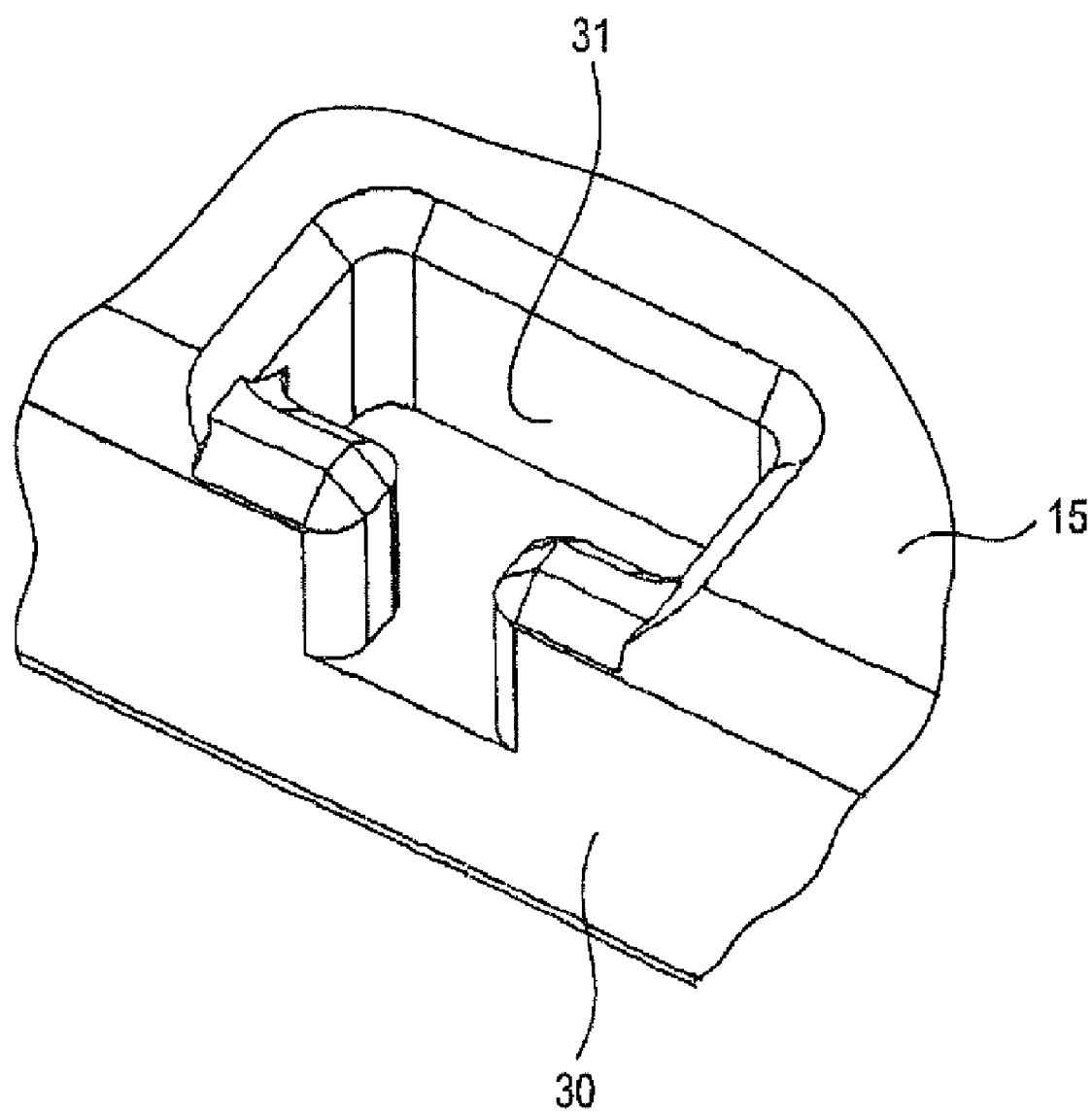
FIG. 3 is an external perspective view of the fixing parts for the inner cover shown in FIG. 2.
Figure 4:
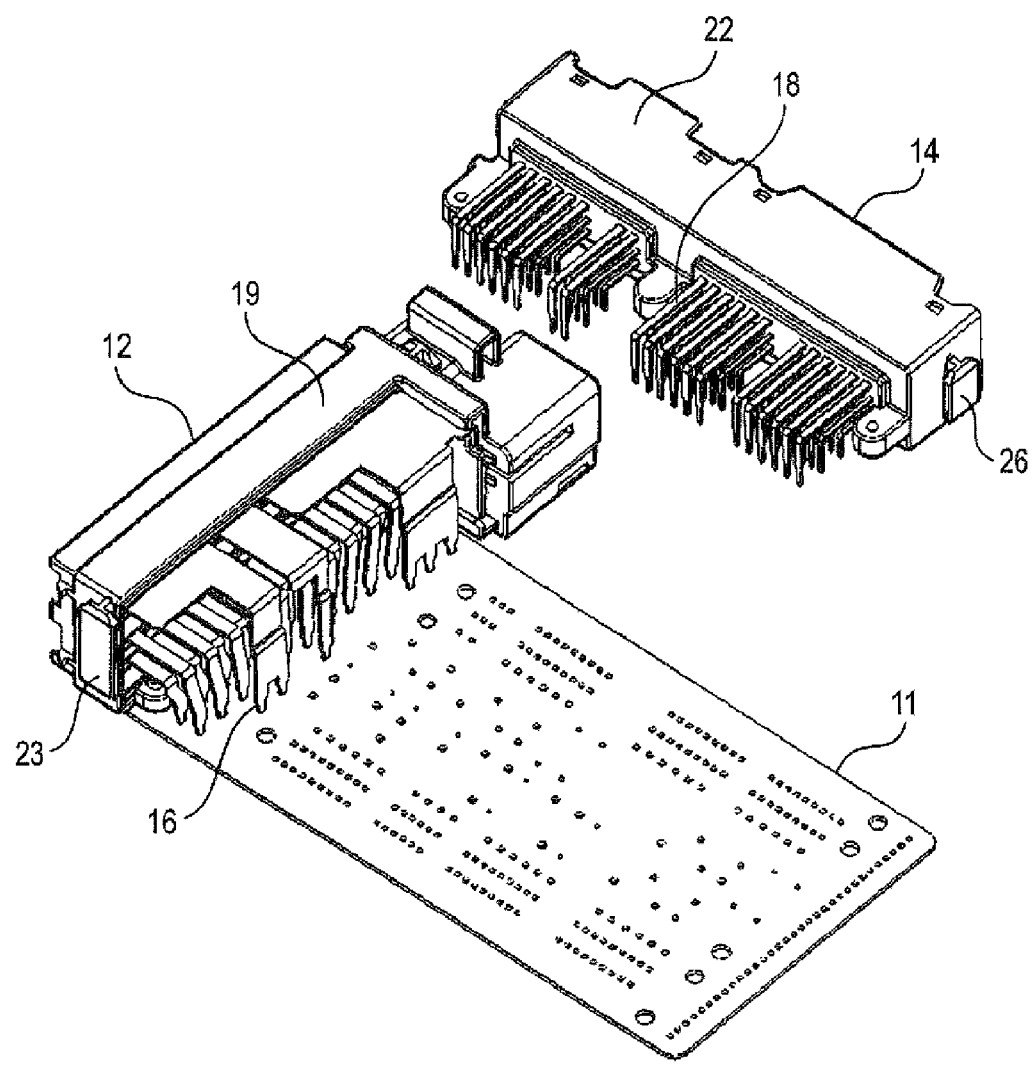
FIG. 4 is an external perspective view of a state before mounting the connector blocks to the printed circuit board, describing a step of the assembling process of the junction block shown in FIG. 1.
Figure 5:
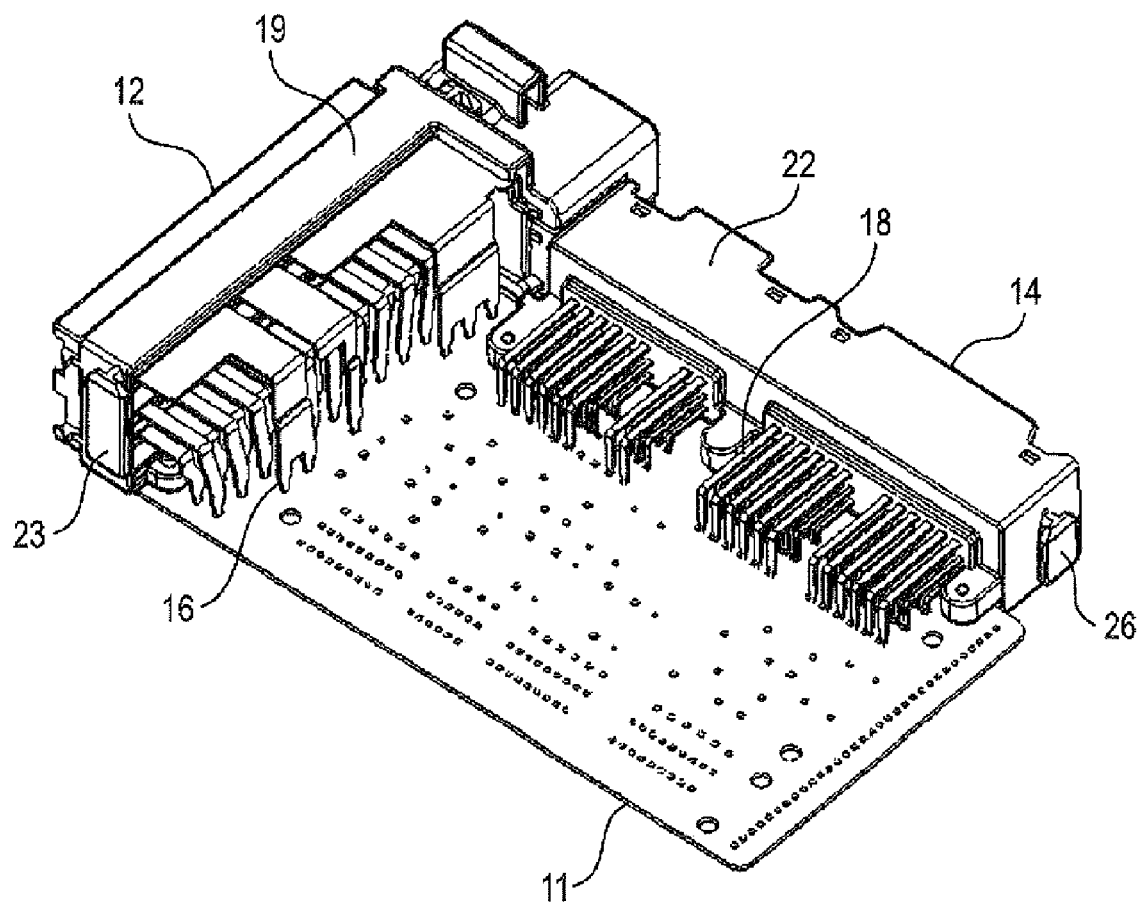
FIG. 5 is an external perspective view of a state after mounting the first connector block to the printed circuit board, describing a step of the assembling process of the junction block shown in FIG. 1.
Figure 6:
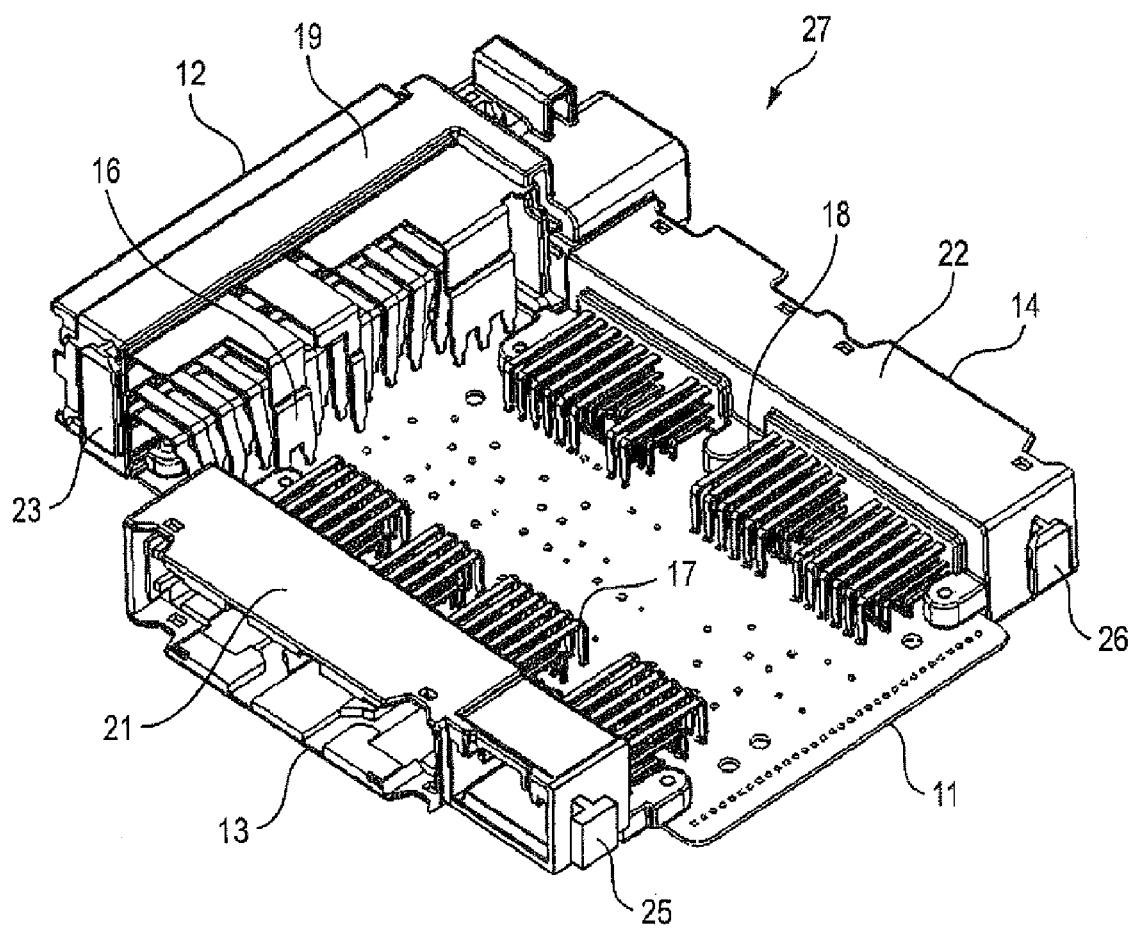
FIG. 6 is an external perspective view of a state after mounting the second connector block to the printed circuit board, describing a step of the assembling process of the junction block shown in FIG. 1.
Figure 7:
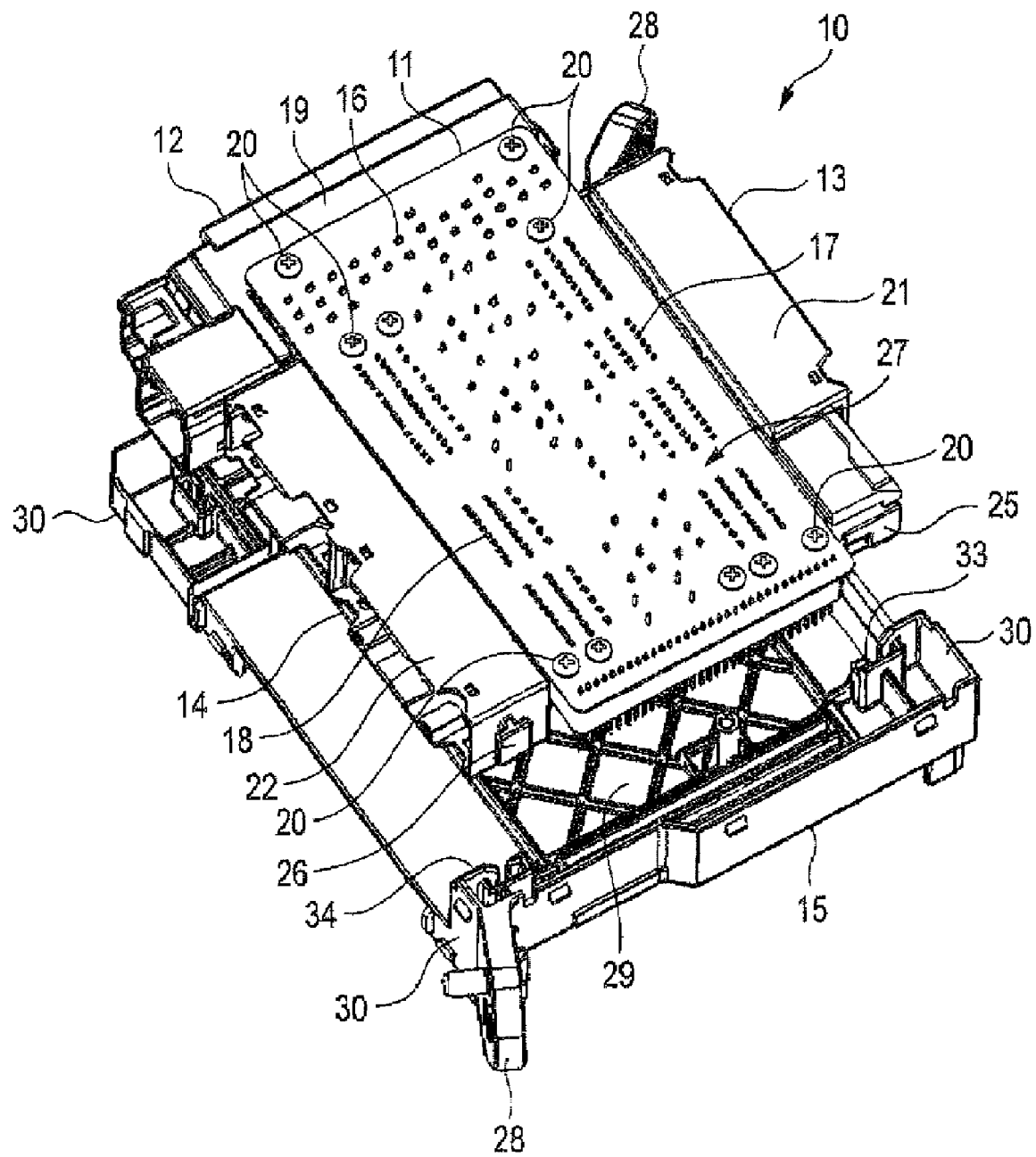
FIG. 7 is an external perspective view of a state when the assembly is mounted to the inner cover, describing a step of the assembling process of the junction block shown in FIG. 1.
Figure 8:
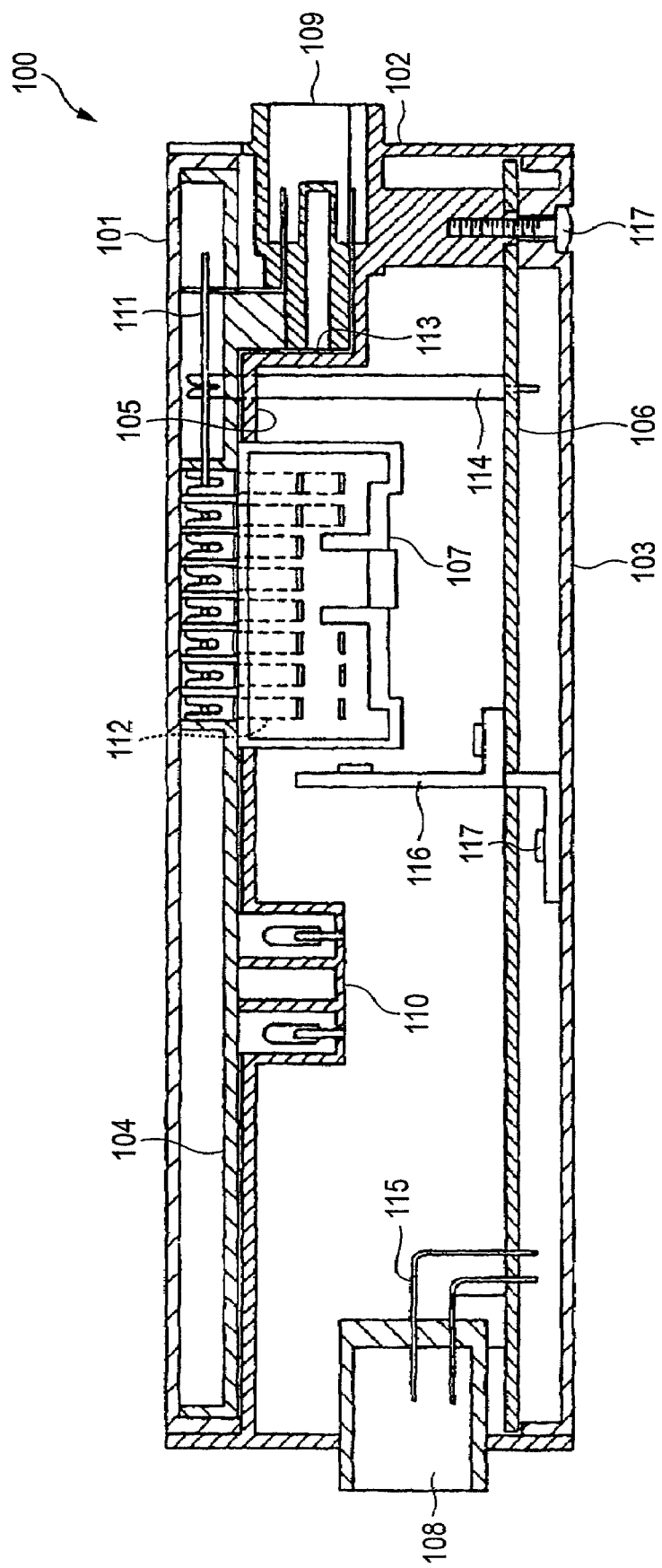
FIG. 8 is a sectional view showing a conventional junction block.

FIG. 1 is a plan view of the junction block according to one embodiment of the invention. FIG. 2 is an external perspective view of the inner cover used in the junction block shown in FIG. 1. FIG. 3 is an external perspective view of the fixing parts for the inner cover shown in FIG. 2. FIG. 4 is an external perspective view of a state before mounting the connector blocks to the printed circuit board, describing a step of the assembling process of the junction block shown in FIG. 1. FIG. 5 is an external perspective view of a state after mounting the first connector block to the printed circuit board, describing a step of the assembling process of the junction block shown in FIG. 1. FIG. 6 is an external perspective view of a state after mounting the second connector block to the printed circuit board, describing a step of the assembling process of the junction block shown in FIG. 1. FIG. 7 is an external perspective view of a state when the assembly is mounted to the inner cover, describing a step of the assembling process of the junction block shown in FIG. 1.

As shown in FIG. 1, a junction block 10 as one embodiment of the invention includes a printed circuit board 11, a fuse block 12, a first connector block 13, a second connector block 14 and an inner cover 15.

The printed circuit board 11 is provided with a rectangular copper core substrate. Distribution wiring circuit (now shown) is printed on a back surface of the printed circuit board 11 that is opposite to the surface shown in FIG. 1. On the upper edge side in FIG. 1, a plurality of fuse terminals 16 provided in the fuse block 12 are passed through the board from a surface thereof and electrically connected with the distribution wiring circuit by soldering.

Further, in the printed circuit board 11, on the right edge side in FIG. 1, circuit board side ends of a plurality of first connector terminals 17 provided in the first connector block 13 are passed through the board from the surface thereof and electrically connected with the distribution wiring circuit by soldering. On the left edge side in FIG. 1, circuit board side ends of a plurality of second connector terminals 18 provided in the second connector block 14 are passed through the board from the surface thereof and electrically connected with the distribution wiring circuit by soldering.

In the printed circuit board 11, on the upper edge portion in FIG. 1, a fuse holder 19 including the fuse block 12 is fixed by screws 20. On the right edge potion in FIG. 1, a first connector housing 21 including the first connector block 13 is fixed by screws 20. On the left edge potion in FIG. 1, a second connector housing 22 including the second connector block 14 is fixed by screws 20.

In the printed circuit board 11, electronic elements (not shown) are mounted on the central portion of the surface of the board. Lead portions of the electronic elements are passed through the board from the surface thereof and electrically connected with the distribution wiring circuit by soldering.

In the fuse block 12, the fuse terminals 16 include upstream terminals and downstream terminals. The upstream and downstream terminals are electrically connected with auto-fuses (not shown) in series. The current supplied from the upstream terminal is transmitted to the downstream terminal through the auto-fuses, and then distributed to the first connector terminals 17 and the second connector terminals 18.

The fuse holder 19 of the fuse block 12 is made of a resin that is not conductive, and is formed into a box-like shape having an opening on the upper side in FIG. 1 to accommodate the fuse terminals 16. In the fuse holder 19, a first engaging projection 23 constituting a part of the fixing parts is formed on the side of the first connector housing 21. The first engaging projection 23 forms a slide engaging portion projecting into T-shape.

The first connector housing 21 of the first connector block 13 is made of a resin that is not conductive, and is formed into a box-like shape having an opening on the right side in FIG. 1 to accommodate the first connector terminals 17. The first connector terminals 17 are connected with load circuits on the electric connection part side. In the first connector housing 21, a second engaging projection 24 constituting another part of the fixing parts is formed on the side of the fuse holder 19 and a third engaging projection 25 constituting another part of the fixing parts is formed on the opposite side of the fuse holder 19. The second engaging projection 24 forms a slide engaging portion projecting into L-shape. The third engaging projection 25 forms a slide engaging portion projecting into T-shape.

The second connector housing 22 of the second connector block 14 is made of a resin that is not conductive, and is formed into a box-like shape having an opening on the left side in FIG. 1 to accommodate the second connector terminals 18. The second connector terminals 18 are connected with load circuits on the electric connection part side. In the second connector housing 22, a fourth engaging projection 26 constituting another part of the fixing parts is formed on the opposite side of the fuse holder 19. The fourth engaging projection 26 forms a slide engaging portion projecting into T-shape.

The inner cover 15 is made of a resin that is not conductive, and has an outer shape slightly larger than the outer shape of an assembly 27 that is formed by integrating the fuse holder 19 fixed by screws on the upper side in FIG. 1, the first connector housing 21 fixed by screws on the right side in FIG. 1 and the second connector housing 22 fixed by screws on the left side in FIG. 1 so as to surround the printed circuit board 11 at the center. A pair of vehicle fixing portions 28 project from the inner cover 15.

As shown in FIG. 2, the inner cover 15 includes a plate portion 29 with a predetermined thickness at the center thereof, and block portions 30 formed into box-like shapes at four corners thereof. The inner cover 15 supplies a certain level of high stiffness by the plate portion 29 and four block portions 30.

In the inner cover 15, a first engaging projection receiver 31 is formed on right side of one of these four block portions 30, which is located on rear side in FIG. 2 corresponding to the first engaging projection 23 of the fuse holder 19. A second engaging projection receiver 32 is formed on front side of one of these four block portions 30, which is located on rear side in FIG. 2 corresponding to the second engaging projection 24 of the first connector housing 21. The first engaging projection receiver 31 forms a slide engaging portion having T-shaped opening. The second engaging projection receiver 32 forms a slide engaging portion having L-shaped opening.

Further, in the inner cover 15, a third engaging projection receiver 33 is formed on rear side of one of these four block portions 30, which is located on front side in FIG. 2 corresponding to the third engaging projection 25 of the second connector housing 22. A fourth engaging projection receiver 34 is formed on rear side of one of these four block portions 30, which is located on left side in FIG. 2 corresponding to the fourth engaging projection 26 of the second connector housing 22. The third engaging projection receiver 33 forms a slide engaging portion having T-shaped opening. The fourth engaging projection receiver 34 forms a slide engaging portion having T-shaped opening.

As shown in FIG. 3, the first engaging projection receiver 31 has the opening extending in the vertical direction; the fuse holder 19 can be positioned and then fixed to the inner cover 15 by inserting the first engaging projection 23 from the upper side. The second, third and fourth engaging projection receivers 32, 33, 34 provide functions similar to those of the first engaging projection receiver since they have similar structures. Accordingly, description of the overlapping features for each engaging projection receiver is omitted.

Next, with reference to FIGS. 4 to 7, assembling process of the junction block 10 will be described.

As shown in FIG. 4, first, the fuse terminals 16 are passed though the printed circuit board 11 from the surface thereof, and soldered to the distribution wiring circuit on the back surface of the printed circuit board 11, and the fuse holder 19 is fixed by screws to the printed circuit board 11.

As shown in FIG. 5, next, the second connector terminals 18 are passed though the printed circuit board 11 from the surface thereof, and soldered to the distribution wiring circuit on the back surface of the printed circuit board 11, and the second connector housing 22 is fixed by screws to the printed circuit board 11.

As shown in FIG. 6, then, the fist connector terminals 17 are passed though the printed circuit board 11 from the surface thereof, and soldered to the distribution wiring circuit on the back surface of the printed circuit board 11, and the first connector housing 21 is fixed by screws to the printed circuit board 11. Thus, the assembly 27 is integrated by fixing by screws the fuse holder 19, the first connector housing 21 and the second connector housing 22 so as to surround outside of the printed circuit board 11 at the center.

After that, as shown in FIG. 7, the assembly 27 as shown in FIG. 6 is reversed upside down and moved downward from a position above the inner cover 15. By moving the assembly 27 downward, the first engaging projection 23 of the fuse holder 19, the second engaging projection 24 of the first connector housing 21, the third engaging projection 25 of the first connector housing 21 and the fourth engaging projection 26 of the second connector housing 22 are inserted into the first engaging projection receiver 31, the second engaging projection receiver 32, the third engaging projection receiver 33 and the fourth engaging projection receiver 34 of the inner cover 15, respectively, so that the assembly 27 is fixed onto the inner cover 15.

Thus, by retaining the first to fourth engaging projections 23,24,25,26 disposed on the outside of the assembly 27 to the first to fourth engaging projection receivers 31,32,33,34 disposed on the outer edge portion of the plate portion 29 of the inner cover 15, respectively, the junction block 10 is fixed such that the plate portion 29 of the inner cover 15 is in parallel with the printed circuit board 11 while being apart from each other. Finally, the vehicle fixing portions 28 are engaged in an engine room or a compartment etc. in a vehicle, and the fuse holder 19, the first connector housing 21 and the second connector housing 22 are connected with mating connectors.

According to the junction block 10 as described above, since the printed circuit board 11 is fixed to the inner cover 15 through the first to the fourth engaging projections 23,24,25, 26 provided in the fuse block 12, the first and second connector blocks 13,14 and the first to fourth engaging projection receivers 31,32,33,34, the assembly 27 incorporating the printed circuit board 11, the fuse block 12, and the first and second connector blocks 13,14 is made to have high stiffness. Accordingly, while no rigid member such as bus bar is mounted therein, the junction block provides stable quality since stress such as bending stress is not applied directly to the printed circuit board 11.

Further, according to the junction block 10, as the fixing parts, by using the slide engaging portions configured by the first to fourth engaging projections 23,24,25,26 having T-shape or L-shape and the first to fourth engaging projection receivers 31,32,33,34 having the corresponding shapes, the mating operation can be performed by a simple way as compared with screw fixture. The fuse block 12 and the connector blocks 13,14 can be fixed to the inner cover 15 without positional error.

Furthermore, according to the junction block 10, by fixing the assembly 27 incorporating the printed circuit board 11, the fuse block 12, and the first and second connector blocks 13,14 to the inner cover 15 through the first to fourth engaging projection receivers 31,32,33,34 located in the outer edge portion of the plate portion 29 of the inner cover 15, the junction block 10 is fixed such that the plate portion 29 of the inner cover 15 is in parallel with the printed circuit board 11 while being apart from each other. Accordingly, even if stress such as bending stress is applied to the inner cover 15, the printed circuit board 11 can be avoided from being directly affected by such stress.

The present invention is not limited to the above embodiment, and suitable modifications, improvements, etc., can be made. Furthermore, the material, shape, dimensions, numerical value, form, number, disposition, etc., of each of the constituent elements of the above embodiment are arbitrary, and are not limited in so far as the invention can be achieved.

For example, the shapes and number of parts constituting the fixing parts may be suitably designed in view of availability of molding. It is desirable that the shapes of the parts are designed to be T-shape or L-shape.

What is claimed is:

1. A junction block comprising:
a printed circuit board on which a distribution wiring circuit is formed;
a fuse block which includes a first engaging projection and on which a plurality of fuse electrically connected with the distribution wiring circuit of the printed circuit board are mounted and which is fixed on the printed circuit board;
a connector block which includes a second engaging projection and which supports connector terminals electrically connected with the distribution wiring circuit of the printed circuit board and is fixed on the printed circuit board; and
an inner cover including a plate portion and block portions formed into box-like shapes at four corners of the plate portion, each block portion including an engaging projection receiver formed with an opening;
wherein the first engaging projection in the fuse block and the second engaging projection in the connector block are engaged to the engaging projection receivers in the inner cover, so that the inner cover provides a stiffness to an assembly integrating the printed circuit board, the fuse block and the connector block.

2. The junction block according to claim 1, wherein the first and second engaging projections includes a projection having T-shape or L-shape, and the engaging projection receivers include a hole having a shape corresponding to the projections.

3. The junction block according to claim 1, wherein the plate portion is disposed in parallel with the printed circuit board.

4. The junction block according to claim 1, wherein the inner cover provides support to the printed circuit board via the fuse block and the connector block.

* * * * *